US005640361A

United States Patent [19]
Hessel

[11] Patent Number: 5,640,361
[45] Date of Patent: Jun. 17, 1997

[54] MEMORY ARCHITECTURE

[75] Inventor: Steven R. Hessel, San Jose, Calif.

[73] Assignee: Hewlett-Packard Company, Palo Alto, Calif.

[21] Appl. No.: 641,659

[22] Filed: May 1, 1996

[51] Int. Cl.⁶ .................................................. G11C 8/00
[52] U.S. Cl. .................... 365/233; 365/193; 365/189.02; 365/189.05; 365/230.02
[58] Field of Search ................................ 365/233, 193, 365/189.05, 189.02, 230.02

[56] References Cited

U.S. PATENT DOCUMENTS

| | | | |
|---|---|---|---|
| 4,479,178 | 10/1984 | Schabowski | 364/200 |
| 4,985,868 | 1/1991 | Nakano et al. | 365/193 |
| 5,402,384 | 3/1995 | Fujisawa | 365/222 |
| 5,410,507 | 4/1995 | Tazunoki et al. | 365/189.09 |
| 5,414,660 | 5/1995 | Sugibayashi et al. | 365/200 |
| 5,420,995 | 5/1995 | Taguri | 395/425 |
| 5,434,819 | 7/1995 | Matsijo et al. | 365/189.05 |
| 5,444,665 | 8/1995 | Yamaguchi et al. | 365/230.02 |
| 5,467,314 | 11/1995 | Miyazawa et al. | 365/201 |
| 5,530,955 | 6/1996 | Kaneko | 365/189.05 |

OTHER PUBLICATIONS

NEC Electronics Inc., Dynamic RAM, Fall 1995 Data Book, MOS Integrated Circuit Preliminary Data Sheets, pp. 1109–1157, 1159–1209, 1211–1259.

*Primary Examiner*—Son T. Dinh

[57] ABSTRACT

A memory architecture for providing wide data words up to the width of the address word, or wider than the address word, without requiring separate groups of electrical contacts for data and address. A dynamic random access memory arranged within a package comprises a memory array of dynamic memory cells and a first plurality of electrical contacts of the package each adapted for conducting both address signals and data signals. An address latch is coupled with the first plurality of electrical contacts for receiving the address signals therefrom during an address cycle and coupled with the memory array for transmitting the address signals thereto. A write latch is coupled with the electrical contacts for receiving the data signals therefrom during a data write cycle and coupled with the memory array for transmitting the data signals thereto.

6 Claims, 5 Drawing Sheets

MEMORY ARCHITECTURE

The invention generally relates to memory architecture, and more particularly relates to architecture of dynamic random access memories.

BACKGROUND OF THE INVENTION

Dynamic random access memories (DRAM's) are used in many computer applications, for example in conjunction with cache memories that are incorporated into high performance central processing units.

Typical previously known DRAM's are internally organized so as to provide a narrow data word of only a few bits wide, for example typical width of the data word provided is only one or four bits, while providing a wide memory address word that is sufficient for addressing a typical memory depth of a million or more data words.

In cache memory applications, main memory is organized in an entire cache line that is many bits wide and that is accessed at one time. Accordingly, a plurality of DRAM packages each providing a narrow data word are used in parallel, so as to build up a combined data word having sufficient width for the entire cache line.

For example, as shown in FIG. 1 of the prior art, a central processing unit (CPU) 101 reads data from and writes data into a plurality of packaged DRAM's 111 arranged in parallel to provide a memory. The CPU 101 provides a read or write address to a CPU address bus 105 and further provides a CPU status signal 103 to instruct previously known system logic 106 to read/write the data from/into the packaged DRAM's 111. The system logic 106 transmits the address provided from the CPU address bus 105 onto a memory address bus 107 as a row address and a column address of the packaged DRAM's.

The packaged DRAM's each have a group of address pins electrically coupled to the memory address bus 107 and further have a separate group of data pins electrically coupled to the CPU data bus 102. The system logic 106 further employs a row-address-strobe (RAS) signal 108 for synchronizing a row address provided to the packaged DRAM's. Thereafter, the system logic 106 employs a column-address-strobe (CAS) signal 109 for synchronizing a row address provided to the packaged DRAM's.

At that time, if the CPU status signal 103 from the CPU 101 is an instruction to write associated data into the packaged DRAM's, a write enable (WE) signal 110 synchronizes transferring the write data on the CPU data bus 102, provided from the CPU 101, into the packaged DRAM's 111 through the data pins.

In contrast, if the CPU status signal 103 form the CPU 101 is an instruction to read associated data from the packaged DRAM's, then after a short delay, data from the packaged DRAM's is outputted on the CPU data bus 102 through the data pins and is received by the CPU 101. The system logic 106 coordinates the timing of the receiving of the read data by the CPU 101 by using a ready signal 104.

One reason why packaged DRAM's generally have narrow data words is that using typical previously known DRAM architectures to provide wider data words would require more electrical connections to data pins, which are an expensive resource for each packaged DRAM.

While previously known architectures for packaged DRAM's provide some advantages, some limitations still remain. In previously known DRAM architectures that use separate electrical connections for data and address, address pins are not available for transferring data, and data pins are not available for transferring addresses.

What is needed is a memory architecture that provides wide data words up to the width of the address word or wider than the address word, without requiring separate groups of electrical contacts for data and address.

SUMMARY OF THE INVENTION

The memory architecture of the present invention provides wide data words up to the width of the address word, or wider than the address word, without requiring separate groups of electrical contacts for data and address.

Briefly and in general terms, the invention provides a dynamic random access memory arranged within a package comprising a memory array of dynamic memory cells, and a first plurality of electrical contacts of the package each adapted for conducting both address signals and data signals. An address latch is coupled with the first plurality of electrical contacts for receiving the address signals therefrom during an address cycle and coupled with the memory array for transmitting the address signals thereto. A write buffer is coupled with the electrical contacts for receiving the data signals therefrom during a data write cycle and coupled with the memory array for transmitting the data signals thereto.

To provide fast and efficient operation of the invention, at least one additional electrical contact of the package, separate from the first plurality of electrical contacts for conducting both address and data signals, is adapted for conducting at least one address synchronization signal. Control logic arranged within the package is coupled with the additional electrical contact for receiving the address synchronization signal and is coupled with the write buffer for controlling the write buffer in response to the address synchronization signal.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
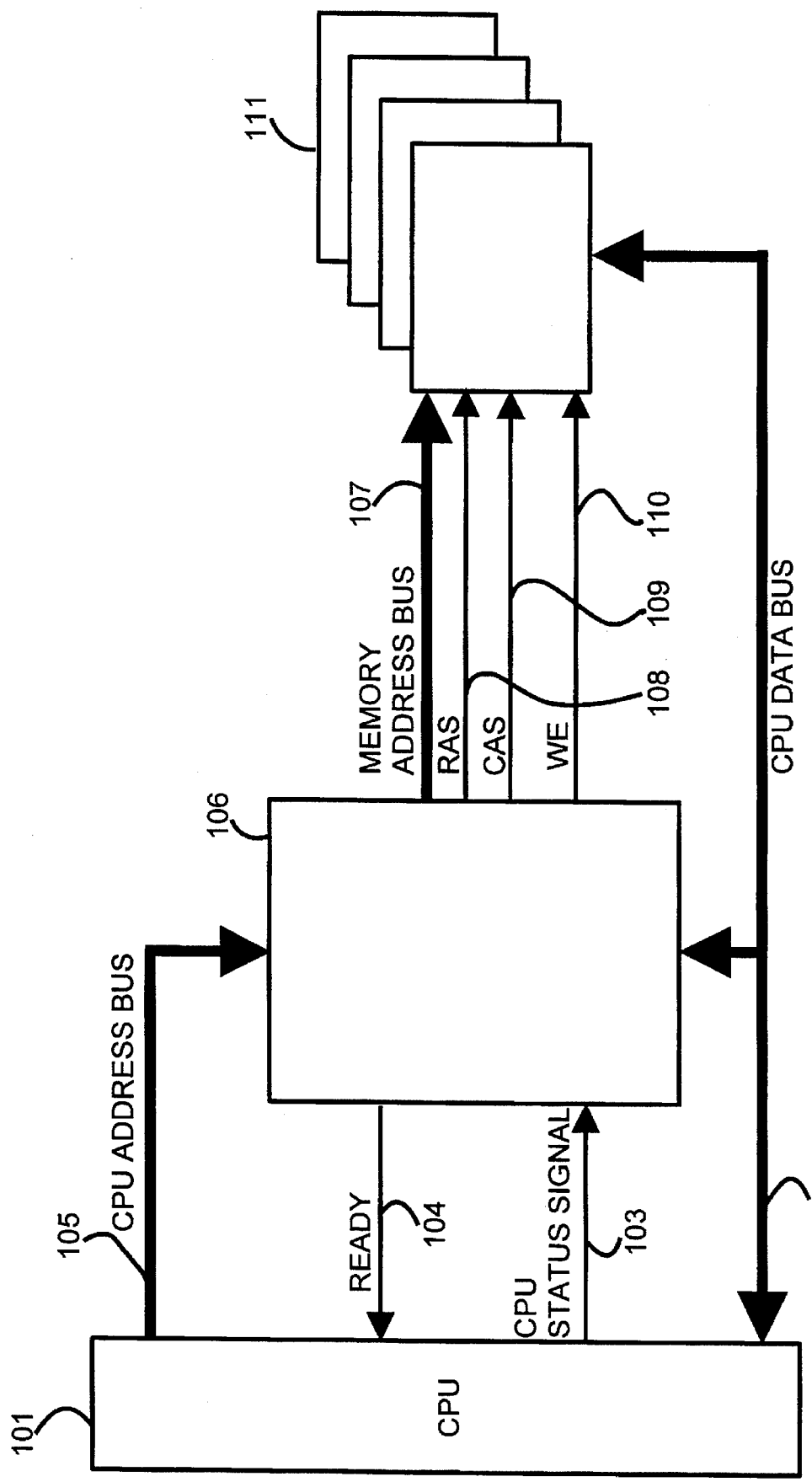
FIG. 1 is a block diagram showing an arrangement of packaged dynamic random access memories of the prior art.
Figure 2:
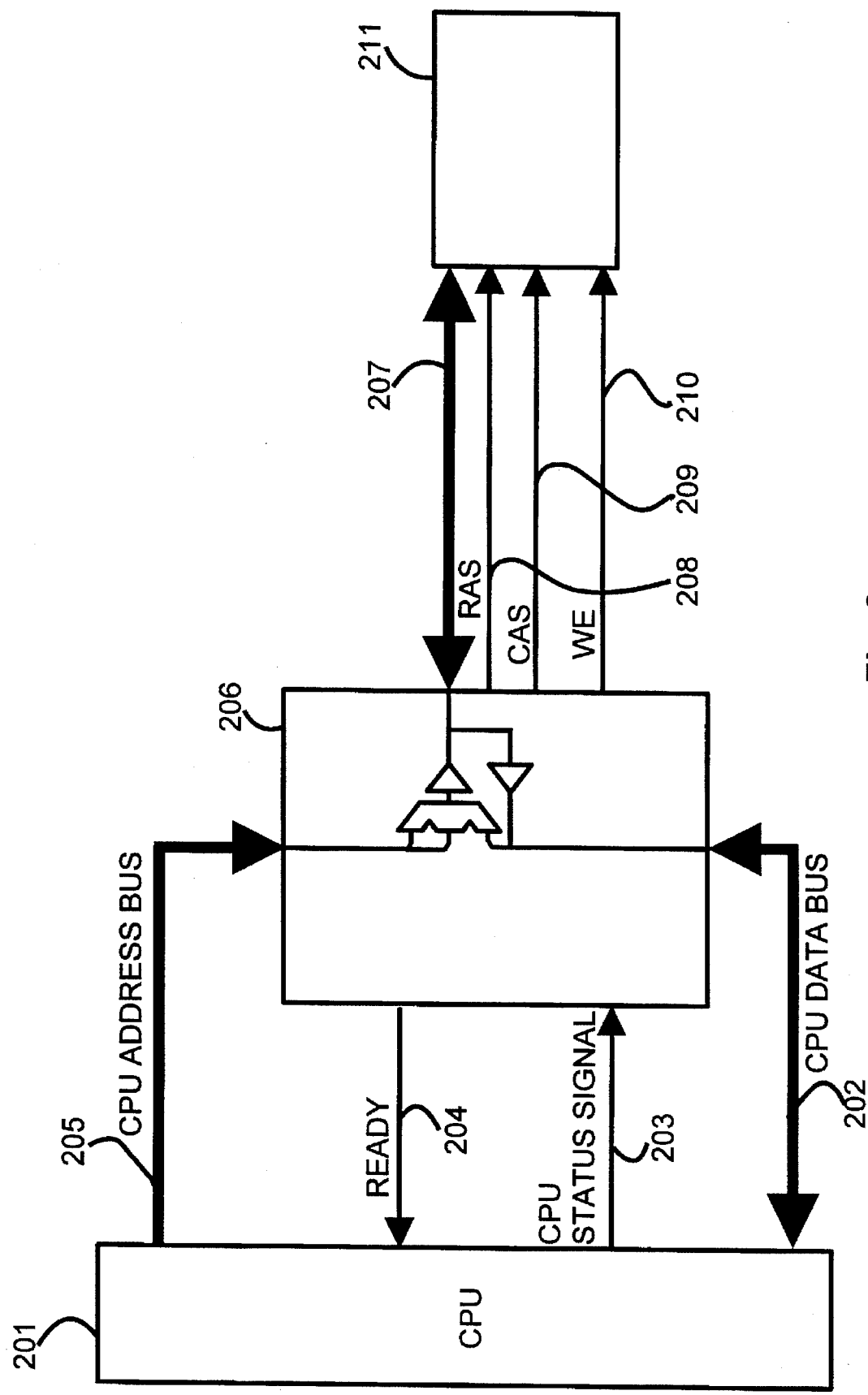
FIG. 2 is a block diagram showing an arrangement of a preferred embodiment of the dynamic random access memory of the present invention.

FIG. 2 is a block diagram showing an arrangement of a preferred embodiment of the dynamic random access memory of the present invention. In cache memory applications, an entire cache line of many bits wide is accessed at one time. Accordingly, in the preferred embodiment of the present invention a single DRAM package provides a data word having sufficient width for the entire cache line.

For example, as shown in FIG. 2, a central processing unit (CPU) 201 incorporating a cache memory reads an entire cache data line from, and writes an entire cache data line into, a single packaged DRAM 211 that provides a main memory. The CPU 201 provides a read or write address to a CPU address bus 205 and further provides a CPU status signal 203 to instruct a system logic 206 adapted to read/write the data from/into the single packaged DRAM 211.

In accordance with the principles of the invention, system logic 206 is adapted to transmit both address and data over the same lines of a single bus, referred to herein as the address/data bus 207. In the preferred embodiment, the system logic 206 includes a multiplexor and associated buffers as shown in FIG. 2 for transferring an address during one or more address cycles of the address/data bus and for transferring data during one or more data cycles of the address/data bus.

In the preferred embodiment, the address is provided from the CPU address bus 205 and transferred as a row address and a column address onto the address/data bus 207 coupled with the packaged DRAM 211. The system logic 206 switches a row-address-strobe (RAS) signal 208 from a high (H) level to a low (L) level while providing the row address, thereby latching that signal in the packaged DRAM 211 as the row address of the packaged DRAM. Thereafter, the system logic 206 switches the column-address-strobe (CAS) signal 209 from a high "H" level to a low "L" level while providing the column address, thereby latching that signal in the packaged DRAM 211 as the row address of the dynamic RAM.

If the CPU status signal 203 from the CPU 201 is an instruction to write, then the data is provided from the CPU data bus 202. The data is transferred by the multiplexor of the adapted system logic 206 onto the address/data bus 207 coupled with the packaged DRAM 211 through the electrical contacts. A write enable (WE) signal 210 is switched from "H" to "L" level to write the data into the packaged DRAM 211.

In contrast, if the CPU status signal 203 from the CPU 201 is an instruction to read associated data from the packaged DRAM, then after a short delay, data from the packaged DRAM is outputted on the address/data bus 207 through the electrical contacts, and is subsequently transferred by the system logic to the CPU data bus to be received by the CPU 201. In the preferred embodiment, the system logic 206 coordinates the timing of the receiving of the read data by the CPU 201 by using the a ready signal 204.

Figure 3:
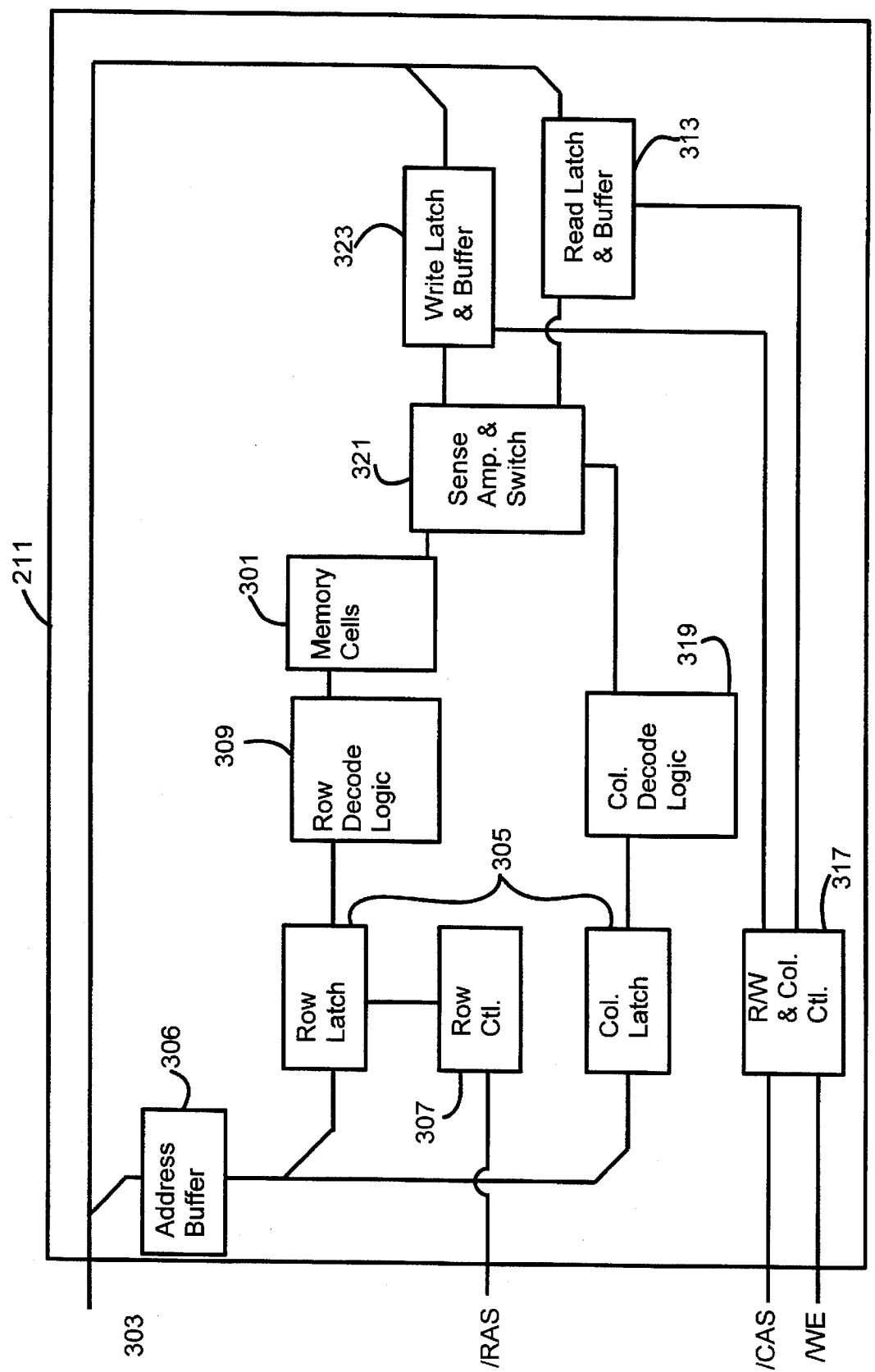
FIG. 3 is a detailed block diagram of the dynamic random access memory shown in FIG. 2.

FIG. 3 is a detailed block diagram of the dynamic random access memory 211 shown in FIG. 2. The invention provides a dynamic random access memory arranged within a package comprising a memory array of dynamic memory cells 301 and a first plurality of electrical contacts 303 of the package each adapted for conducting both address signals and data signals. Accordingly, the memory architecture of the present invention provides wide data words up to the width of the address word, or wider than the address word, without requiring separate groups of electrical contacts for data and address An address latch 305, preferably comprising a row address latch and a column address latch, is coupled with the electrical contacts 303 through an optional address buffer 306 for receiving the address signals therefrom during an address cycle and coupled with the memory array 301 for transmitting the address signals thereto.

To provide fast and efficient operation of the invention, at least one additional electrical contact of the package separate from the first plurality of electrical contacts is adapted for conducting at least one address synchronization signal. In the preferred embodiment, a pair of electrical contacts of the package separate from the first plurality of electrical contacts are adapted for conducting two address synchronization signals: the column-address-strobe (CAS) and row-address-strobe (RAS).

Control logic is coupled with the additional electrical contact for receiving the address synchronization signal and is coupled with the write buffer for controlling the write buffer in response to the address synchronization signal and write enable signal (WE). For example, the column latch is activated by read/write and column control logic 317 coupled thereto in response to the column-address-strobe (CAS) received by the column control logic.

A sense amplifier and switch 321 is coupled with memory array 301. The column latch is coupled though column decode logic 319 to the sense amplifier and switch 321 for selecting the data columns addressed.

The row latch is activated by row control logic 307 coupled thereto in response to the row-address-strobe (RAS) received by the row control logic. The row latch is coupled with memory array 301 through row decode logic 309 for transmitting the row address to the memory array.

The write buffer 323 preferably includes a latch and is coupled with the electrical contacts 303 for receiving the data signals therefrom during a data write cycle and coupled with the memory array for transmitting the data signals thereto. Similarly, a read buffer 313 preferably including a read latch is coupled with the memory array for receiving the data signals therefrom during a data read cycle and coupled with the electrical contacts 303 for transmitting the data signals thereto. As shown in FIG. 3, the write buffer and read buffer are each activated by the read/write and column control logic 317 coupled thereto in response to the column-address-strobe (CAS) and the write enable (WE) signal.

The sense amplifier and switch 321 is coupled with the control logic and coupled with the read buffer and latch and write buffer and latch for multiplexing the data signals therebetween in response to the address synchronization signal.

In the dynamic random access memory (DRAM), the memory cells require repetitive application of control signals in order to retain stored data. Such repetitive application of the control signals is employed herein, as needed, as a refresh operation.

Figure 4:
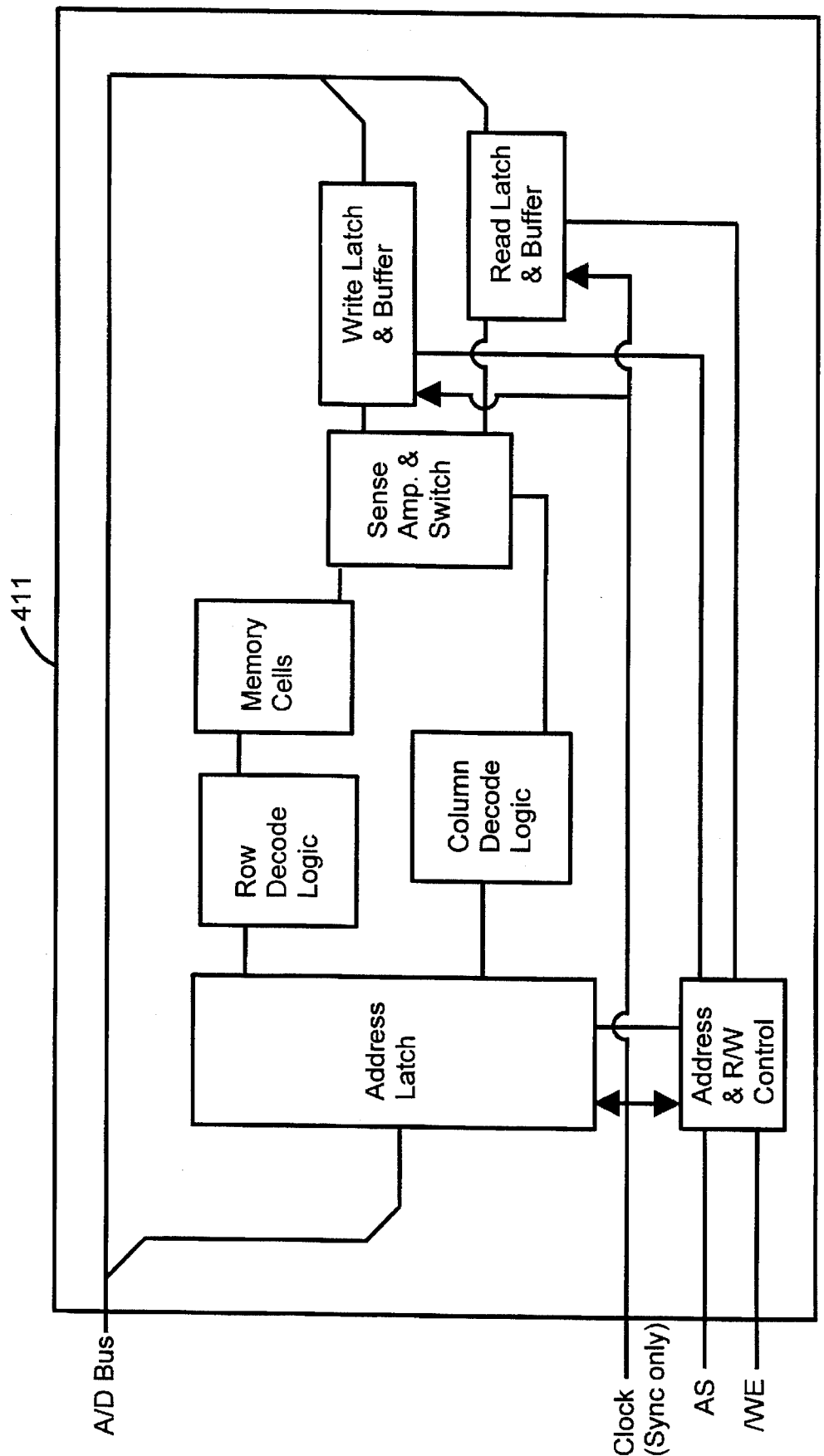
FIG. 4 is a detailed block diagram of an alternative embodiment of the dynamic random access memory of the invention.

FIG. 4 is a detailed block diagram of an alternative embodiment of the dynamic random access memory 411 of the invention, which is generally similar to the preferred embodiment including operative coupling of the plurality of electrical contacts of the package each adapted for conducting both address signals and data signals, address latch, write latch, read latch, row and column decode logic, sense amplifier and switch, with the array of memory cells as shown in FIG. 4, but is configured as a synchronous dynamic random access memory employing a clock signal coupled with the address latch, address & read/write (R/W) control, write latch and/or read latch.

In the alternative embodiment, all of the address is provided in a single cycle. Accordingly, as shown in FIG. 4, a single address strobe, AS, is used as the address synchronization signal and is coupled address and read/write control logic for controlling the address latch, instead of separate RAS and CAS signals as in the preferred embodiment. The control logic is coupled with the additional electrical contact for receiving the address synchronization signal and the write enable, WE, control signal and is coupled with the write latch for controlling the write latch in response to the control signal.

Figure 5:
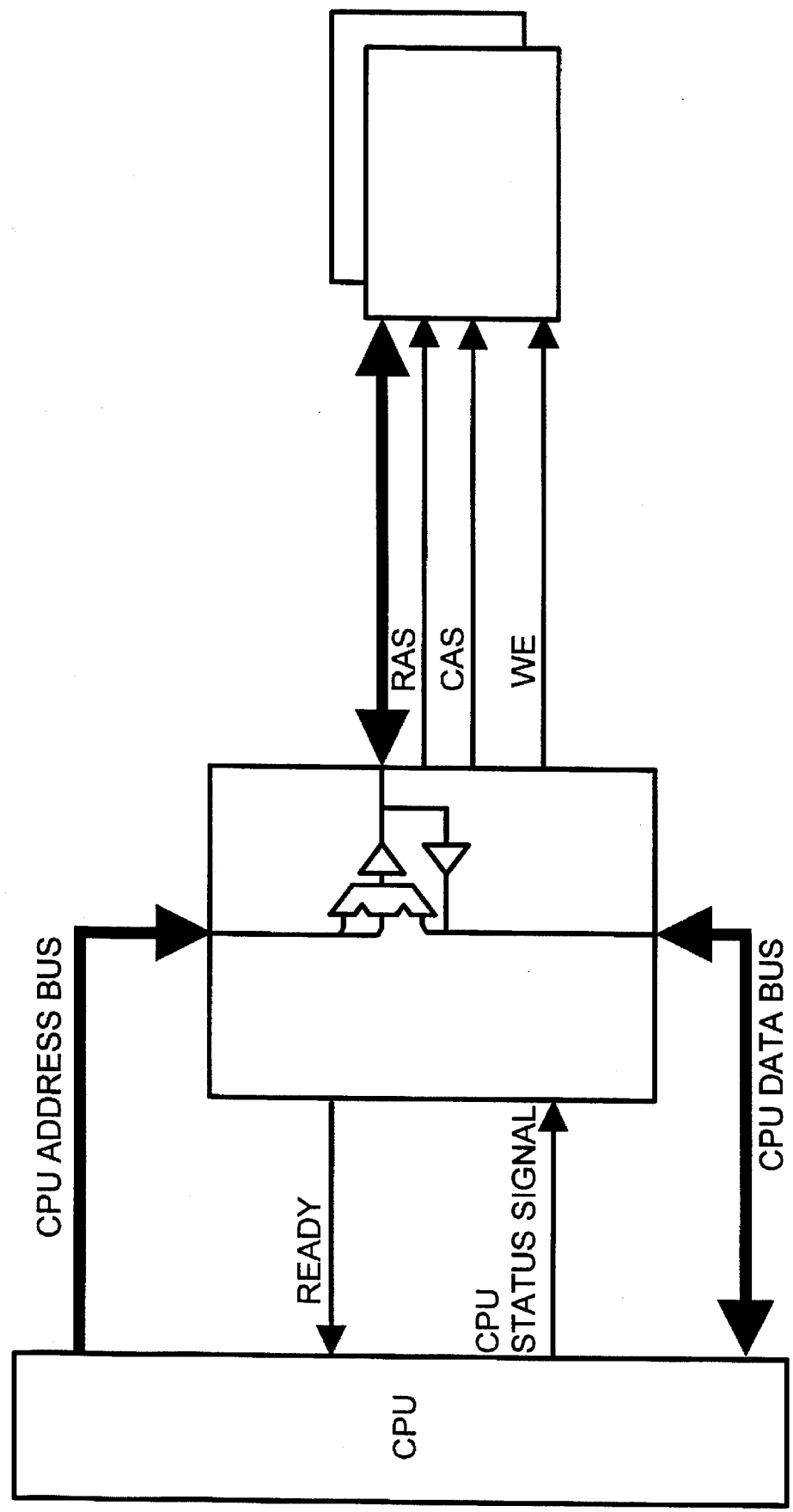
FIG. 5 is a block diagram showing an arrangement of another alternative embodiment of the dynamic random access memory of the present invention.

It should be understood that although the present invention is advantageously applied to a single packaged DRAM as shown in FIG. 2 and discussed in detail previously herein, the invention is not limited to such embodiments. In another alternative embodiment, the principles of the invention are applied to more than one packaged DRAM to provide a main memory. For example, as shown in FIG. 5, a central processing unit (CPU) incorporating a cache memory reads an entire cache data line from, and writes an entire cache data line into, more than one packaged DRAM, which are combined in parallel to provide the main memory. The principles of the invention already discussed provide that the system logic adapted to transmit both address and data over the same lines of a single bus (the address/data bus). Therefore, it should be understood from the principles of the invention that each packaged DRAM advantageously provides a data word having substantial width. Accordingly, as shown in FIG. 5, more than one packaged DRAM, each providing a data word having substantial width, are used in parallel, so as to build up a combined data word having sufficient width for the entire cache line.

As discussed, the memory architecture of the present invention provides wide data words up to the width of the address word, or wider than the address word, without requiring separate groups of electrical contacts for data and address. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. A dynamic random access memory arranged within a package comprising:

a memory array of dynamic memory cells;

a first plurality of electrical contacts of the package each adapted for conducting both address signals and data signals;

an address latch coupled with the first plurality of electrical contacts for receiving the address signals therefrom and coupled with the memory array for transmitting the address signals thereto;

a write latch coupled with the electrical contacts for receiving the data signals therefrom and coupled with the memory array for transmitting the data signals thereto;

at least one additional electrical contact of the package separate from the first plurality of electrical contacts and adapted for conducting at least one address synchronization signal; and control logic coupled with the additional electrical contact for receiving the address synchronization signal and coupled with the write latch for controlling the write latch in response to the address synchronization signal.

2. A dynamic random access memory arranged within a package as in claim 1 further comprising a read buffer coupled with the memory array for receiving the data signals therefrom and coupled with the electrical contacts for transmitting the data signals thereto.

3. A dynamic random access memory arranged within a package as in claim 2 further comprising a switch coupled with the control logic and coupled with the read buffer and write latch for multiplexing the data signals therebetween in response to the address synchronization signal.

4. A dynamic random access memory arranged within a package comprising:

a memory array of dynamic memory cells;

a first plurality of electrical contacts of the package each adapted for conducting both address signals and data signals;

an address latch coupled with the first plurality of electrical contacts for receiving the address signals therefrom and coupled with the memory array for transmitting the address signals thereto;

a write buffer coupled with the electrical contacts for receiving the data signals therefrom and coupled with the memory array for transmitting the data signals thereto;

at least one additional electrical contact of the package separate from the first plurality of electrical contacts and adapted for conducting at least one address synchronization signal; and control logic coupled with the additional electrical contact for receiving the address synchronization signal and coupled with the write buffer for controlling the write buffer in response to the address synchronization signal.

5. A dynamic random access memory arranged within a package as in claim 4 further comprising a read buffer coupled with the memory array for receiving the data signals therefrom and coupled with the electrical contacts for transmitting the data signals thereto.

6. A dynamic random access memory arranged within a package as in claim 5 further comprising a switch coupled with the control logic and coupled with the read buffer and write buffer for multiplexing the data signals therebetween in response to the address synchronization signal.

* * * * *